US006392957B1

(12) United States Patent
Shubat et al.

(10) Patent No.: US 6,392,957 B1
(45) Date of Patent: May 21, 2002

(54) FAST READ/WRITE CYCLE MEMORY DEVICE HAVING A SELF-TIMED READ/WRITE CONTROL CIRCUIT

(75) Inventors: Alexander Shubat, Fremont; Adam Kablanian, San Jose; Jaroslav Raszka, Fremont; Richard S. Roy, Danville, all of CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 09/728,377

(22) Filed: Nov. 28, 2000

(51) Int. Cl.$^7$ .................................................. G11C 7/22
(52) U.S. Cl. ............. 365/233; 365/230.05; 365/189.02; 365/210; 365/154; 365/156; 365/203
(58) Field of Search .................................. 365/233, 210, 365/154, 156, 189.02, 230.05, 203, 189.01

(56) References Cited

U.S. PATENT DOCUMENTS

| | | | | |
|---|---|---|---|---|
| 4,916,670 A | * | 4/1990 | Suzuki et al. | 365/233 |
| 5,546,355 A | * | 8/1996 | Raatz et al. | 365/233 |
| 5,808,960 A | * | 9/1998 | McClure | 365/233 |
| 5,825,691 A | * | 10/1998 | McClure | 365/189.01 |
| 5,864,696 A | * | 1/1999 | McClure | 713/502 |
| 6,006,339 A | * | 12/1999 | McClure | 713/500 |
| 6,072,732 A | * | 6/2000 | McClure | 365/191 |
| 6,091,629 A | * | 7/2000 | Osada et al. | 365/156 |

* cited by examiner

*Primary Examiner*—Andrew Q. Tran
(74) *Attorney, Agent, or Firm*—Fenwick & West LLP

(57) ABSTRACT

A self-timed write control memory device minimizes the memory cycle time for the cells of the array. The self-timed write control memory device preferably comprises an X-decoder, a word-line driver, a memory cell array, control logic, pre-charge circuits, sense amplifiers, a reference decoder, and a reference word-line driver. The memory device preferably further includes a first reference cell, a second reference cell or logic, a first reference column, a second reference column and a reference sense amplifier. The first reference cell is preferably used for detection of read cycle completion and the second reference cell or logic is used for detection of write cycle completion. The output of the first reference cell and second reference cell are preferably coupled to inputs of a unique reference sense amplifier. The sense amplifier includes special circuitry that uses either the output of the first reference cell or the second reference cell to generate the self-timed clock and there by minimizes the memory cycle time. The second reference cell may be any one of a conventional memory cell or write reference logic.

24 Claims, 8 Drawing Sheets

FAST READ/WRITE CYCLE MEMORY DEVICE HAVING A SELF-TIMED READ/WRITE CONTROL CIRCUIT

BACKGROUND

A. Technical Field

The present invention relates generally to the field of memory logic devices, and more specifically to memory devices having self-timed control logic. More particularly, the present invention relates to memory devices having self-timed write control logic. Still more particularly, the present invention relates to memory devices that have self-timed read control logic and self-timed write control logic.

B. Background of the Invention

Memory devices are well known in the semiconductor industry. The integration of memory cores with other circuitry has increased dramatically due to the proliferation and popularity of Application Specific Integrated Circuits (ASICs). New find improved designs for memory arrays such as for system-on-a-chip applications have increased the demand for shorter write cycle times. Thus, there is a need for memory cores or array designs that implement faster write cycles.

A typical prior art memory device 100 is shown in FIG. 1. As can be seen, the prior art memory device 100 includes an X-decoder 102, a word-line driver 104, a memory cell array 106, a reference column 108, control logic 110, pre-charge circuits 112, and sense amplifiers 114. A typical prior art device also includes a reference decoder 116, a reference word-line driver 118, a reference cell 120 and a reference sense amplifier 122. In prior art memory devices, the reference cell 120 is used to detect the completion of a read cycle or write cycle for the memory array 106. When the reference sense amplifier 122 detects that a read cycle or write cycle is complete for the memory array 106, the reference sense amplifier 122 sends a signal to the control logic 110. More specifically, the reference sense amplifier 122 sends a signal to a self-timed clock (STCLK) (not shown) in the control logic 110 that in turn sends a signal to the pre-charge circuits 112. The pre-charge circuits 112 pre-charge the bit lines of the memory cells (not shown) in the memory array 106 so that the next read cycle or write cycle for the memory array 106 may begin.

A timing diagram illustrating signals for the detection of a read cycle or write cycle and the pre-charging of memory cells in the prior art memory array 106 during normal operation of control logic 110 is shown in FIG. 2.

Before a typical read cycle, the bit line (BL-Read) for memory cell is pre-charged to the VDD level as shown in FIG. 2 by reference point A. During the read cycle, as the cell is read, the bit line is pulled down approximately 100 mV to 200 mV by a current of approximately 100 µA as indicated by reference point B. A reference bit line (RBL) is also pulled down similar to the bit line during the read cycle. Once the read cycle has completed as indicated by reference point B, pre-charging starts until the line is pre-charged as indicated by reference point C. Generally, the completion of a read cycle is indicated by the fact that the reference bit line (RBL) has activated the self-timed clock (STCLK) which in turn begins the pre-charging. At such a time, the read cycle can begin again. It should be noted that while the time required for the bit line to transition from reference point A to reference point B occurs relatively slowly, the pre-charging of the bit-line occurs very quickly because the bit line typically only needs to be charged approximately 100–200 mV.

In comparison, the state of the bit line (BL-Write) during a write cycle has much different timing. Again, before a typical write cycle, the bit line (BL-Write) for memory cell is pre-charged to the VDD level as shown in FIG. 2 by reference point D. During the write cycle, as the cell is written, the bit line is pulled down; and the write cycle is complete as indicated by reference point E. However, in the prior art, pre-charging of BL-Write does not begin until reference point F, which is the point in time when the read cycle is complete. Only after both the read cycle and write cycle are complete will RBL activate STCLK, which in turn initiates the pre-charging of both BL-Read and BL-Write. Thus, in the prior art, there is only one mechanism for initiating the pre-charging of both BL-Read and BL-Write. Consequently, in the prior art there is a "dead time" in write cycles when the pre-charging of BL-Write could begin independently of BL-Read but does not. This is problematic because it unnecessarily increases the write cycle time in prior art memory arrays and ties the pre-charging of both BL-Read and BL-Write to the same trigger event. Yet another difficulty in the prior art is that typically pre-charging after a write requires much more time than pre-charging after a read cycle. Only after reference point G can another write or read cycle begin. It should be noted that the time required for the bit line to transition from reference point D to reference point E occurs relatively quickly because the write drivers pulling the bit line down are large. In addition, the time required for the bit line to transition from reference point F to reference point G is much longer than pre-charging from reference point B to reference point C, because it is charging from ground to VDD as opposed to pre-charging from the 100–200 mV below VDD to VDD. Accordingly, it is desirable to provide a memory device that provides a shorter write cycle time.

SUMMARY OF THE INVENTION

The present invention overcomes the deficiencies and limitations of the prior art with a unique memory device that provides self-timed write control for a memory array. This is particularly advantageous because it minimizes the cycle time for access of the cells of the array. The memory device preferably comprises an X-decoder, a word-line driver, a memory cell array, control logic, pre-charge circuits, sense amplifiers, a reference decoder, and a reference word-line driver. The memory device preferably further includes a first reference cell, a second reference cell or logic, a first reference column, a second reference column and a reference sense amplifier. The first reference cell is preferably used for detection of read cycle completion and the second reference cell or logic is used for detection of write cycle completion. The output of the first reference cell and second reference cell are preferably coupled to inputs of a unique reference sense amplifier. The sense amplifier includes special circuitry that uses either the output of the first reference cell or the second reference cell to generate the self-timed clock and there by minimizes the time of the memory access cycle. The second reference cell may be any one of a conventional memory cell or write reference logic.

These and other features and advantages of the present invention may be better understood by considering the following detailed description of preferred embodiments of the invention. In the course of this description, reference will be frequently made to the attached drawings.

DETAILED DESCRIPTION OF PREFERRED EMBODIMENTS

Figure 3:
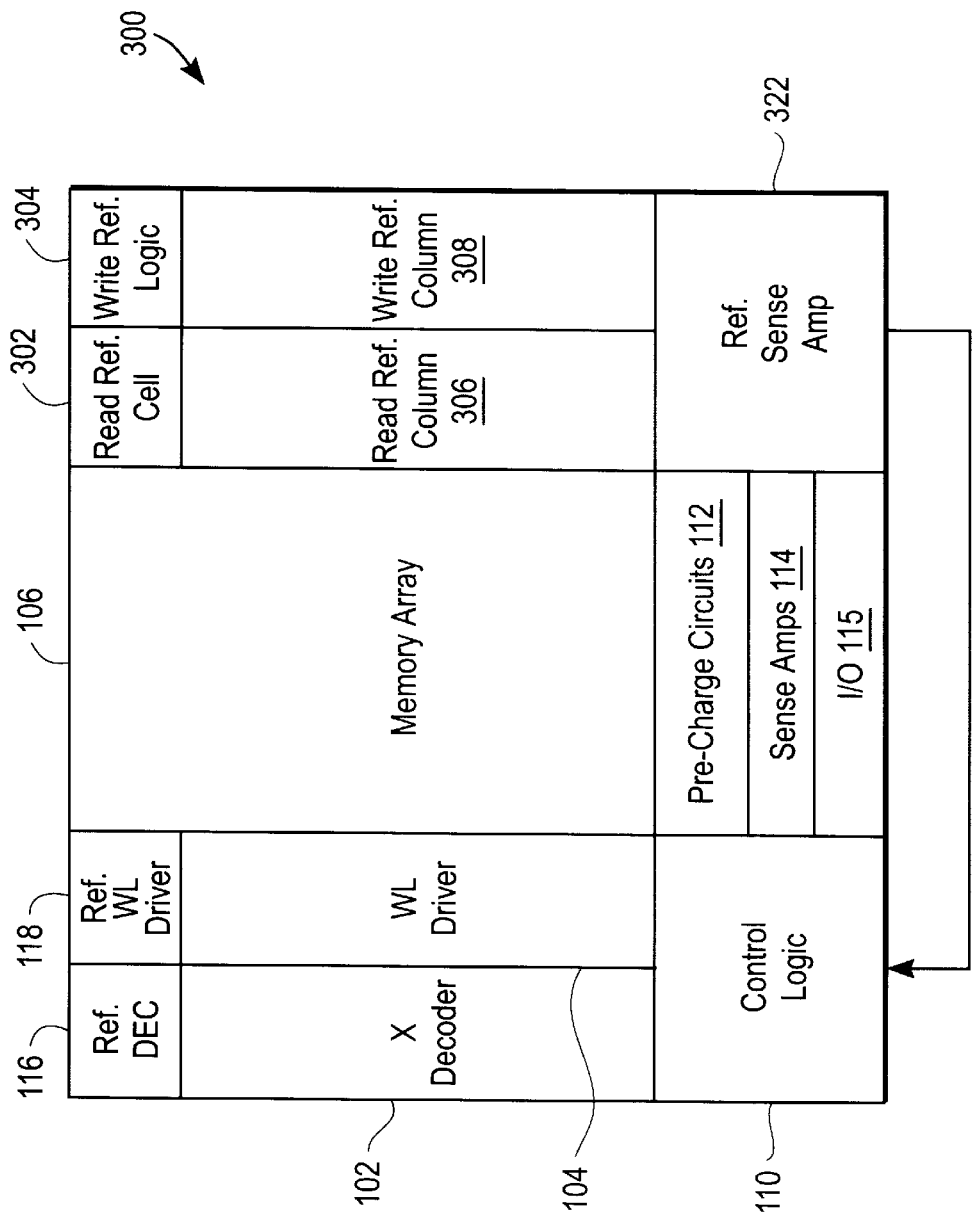
FIG. 3 is a high-level block diagram of a self-timed memory system in accordance with the present invention.

Referring now to FIG. 3, a preferred embodiment of the self-timed write control memory unit 300 in accordance with the present invention will be described. As shown in FIG. 3, the preferred embodiment of the present invention preferably comprises an X-decoder 102, a word-line driver 104, a memory cell array 106, control logic 110, pre-charge circuits 112, sense amplifiers 114, a reference decoder 116, and a reference word-line driver 118. The present invention includes a number of components including those just identified. Each of these components is conventional in certain aspects; however, many of the components are different in ways (that will be identified below as each is discussed) that allow the present invention to provide a unique architecture for a self-timed read and write control in a memory array. For example, the present invention is not discussed with regard to a particular, word or array size since the number of bits input and output could be any number adapted to the needs of the user as will be understood to those skilled in the art. The memory unit 300 preferably further includes a first read reference cell or logic 302, a second write reference cell or logic 304, a first reference column 306, a second reference column 308 and a reference sense amplifier 322. The first reference cell 302 is preferably used for detection of read cycle completion and the second reference cell or logic 304 is used for detection of write cycle completion. The output of the first reference cell 302 and second reference cell 304 are preferably coupled to inputs of a unique reference sense amplifier 322. The reference sense amplifier 322 includes special circuitry that uses either the output of the first reference cell 302 or the write reference logic 304 to generate the self-timed clock. One skilled in the art will realize the present invention is not limited to the organization of a separate read reference cell 302 and a separate write reference cell 304 but may comprise a different structure performing the same function. For example, the read reference cell 302 and the write reference cell 304 may be combined into one read/write reference cell that detects the completion of a read cycle and the completion of a write cycle.

The control and pre-decoding logic 110 receives signals for processing data including control and addressing signals. The control and pre-decoding logic 110 in turn transmits these signals to the other components of the memory unit 300 to control storage in and retrieval of data from the memory unit 300, as will be described in more detail below. The control and pre-decoding logic 110 is formed from conventional digital logic devices formed as part of an integrated circuit, and is similar to conventional types of control logic. The control and pre-decoding logic 110 is notably different in at least one respect, namely that the control and pre-decoding logic 110 receives a self-timed clock signal (STCLK) from the reference sense amplifier 322 that is generated using both (either) the read reference cell 302 and the write reference logic 304.

The X-decoder 102 is coupled to the control and pre-decoding logic 110 to receive addressing signals from the control and pre-decoding logic 110. The X-decoder 102 receives the address signals, identifies which word of the array 106 is to be asserted and generates a signal for the word to be asserted and outputs the signal. The X-decoder 102 has a conventional design as will be understood to those skilled in the art. The outputs of the X-decoder 102 are coupled to the first word-line driver 104. The first word-line driver 104 is advantageously positioned adjacent and closed to the X-decoder 102 to minimize the length of signal lines connecting the devices 102, 104. The first word-line driver 104 is preferably a group of buffer drivers that receive signals from the X-decoder 102 and assert and amplify the signals over a portion of the array 106 so that particular words are accessed. Thus, signals provided in the horizontal direction provide the input from the X-decoder 102 to the memory array 106.

The present invention advantageously provides a memory array 106 having a plurality of cells (not shown). As noted above, the present invention could be used with a variety of other types of memory arrays including those having two or more ports. The memory array 106 preferably includes a plurality of memory cells grouped for access on a word basis. The individual memory cells have a conventional design, however, are enabled on a word basis. The word size may be any size from 1 to n. Those skilled in the art will realize that the memory array 106 may organize the particular cells in any number of ways. The aspect ratio of the memory array 106 may be controlled by grouping cells in a row by groups of 4, 8, 16, 32 or other powers of 2.

Below the memory array 106, the present invention positions the pre-charging circuit 112, and the sense amplifiers 114. Thus, it can be seen with the architecture of the present invention, routing for sending and receiving data is minimized. The pre-charging circuits 112 are conventional types, with the pre-charging circuit 112 charging the lines of the array 106 for reading and writing, and each pre-charging circuit 112 an inputs to a respective the sense amplifier 114. The pre-charging circuits 112 are coupled to the cells of the array by lines (not shown) extending generally vertically over the length of the array 106. The sense amplifiers 114 are positioned below the pre-charging circuits 112. The sense amplifiers 114 generate data to be output from the array 106. This data is passed to conventional input/output (I/O) circuitry 115 for transmission out of the memory unit 300. The conventional I/O circuitry 115 is also the source of data for storage in the array 106 from outside the memory unit 300.

Figure 1:
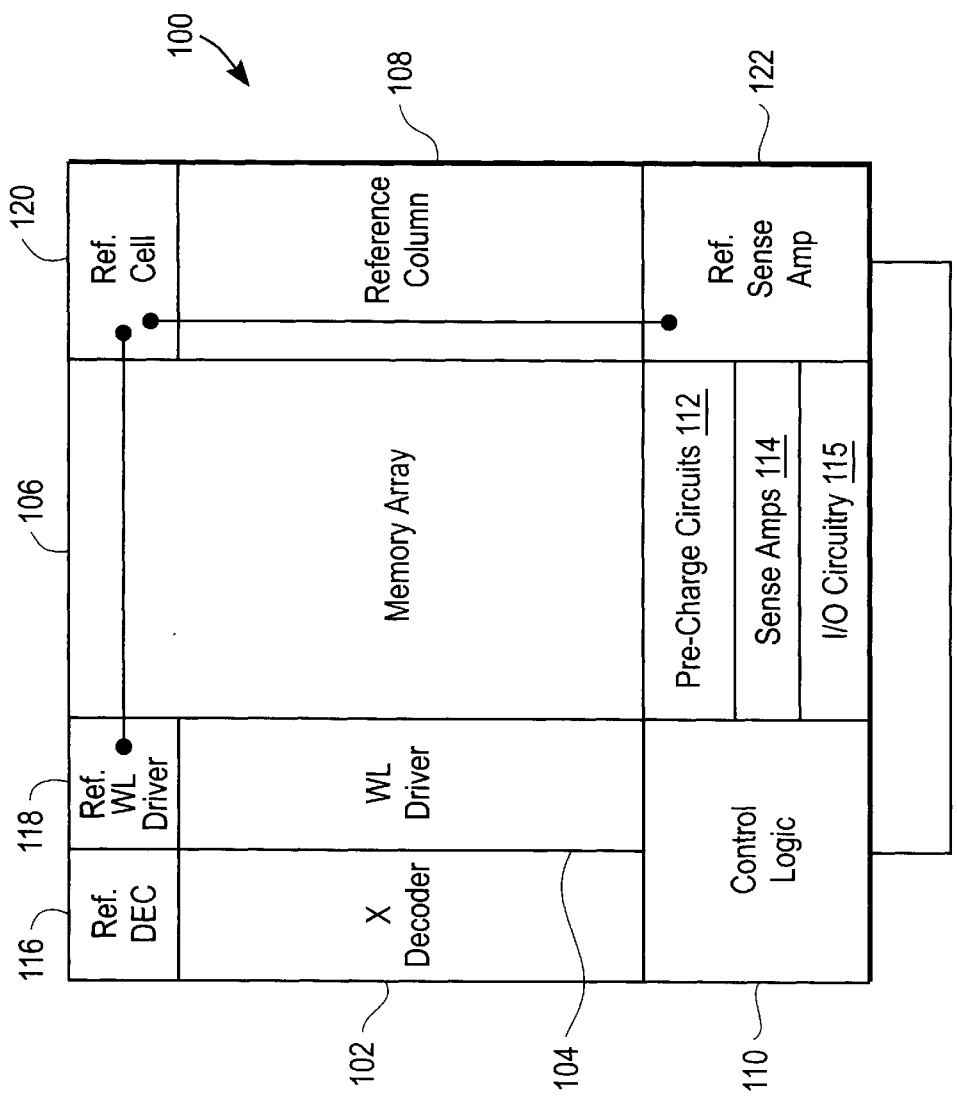
FIG. 1 is a block diagram of a self-timed memory system of the prior art.

The reference decoder 116, reference word-line driver 118 and the first or read reference cell 302 are of conventional types with functionality similar to that described above with reference to FIG. 1. The reference decoder 116 is coupled to the control logic 110 and to the reference word-line driver 118. The reference decoder 116 has functionality similar to that of the X-decoder 102, but specific to determining when to assert the reference word-line driver 118. The reference word-line driver 118 has functionality similar to the word-line drivers 104, and is used to drive signals to the read or write reference cell 302/304. The read reference cell 302 is a memory cell of a conventional type, and its output is used to determine the point at which the read cycle is complete and pre-charging of the bit-lines can begin.

The present invention is particularly advantageous because it provides write reference logic 304. The write reference logic 304 is also coupled to the output of the reference word-line driver 118 to receive signals. The write reference logic 304 is used to determine the point at which the write cycle is complete and pre-charging of the bit-lines can begin. Thus, the present invention indicates both when the read cycle is complete and when the write cycle is complete. Thus, depending on whether the array 106 is being read or written the memory access cycle time can be minimized. Particular embodiments for the write reference logic 304 will be described in more detail below with reference to FIGS. 7 and 8. While the write reference logic 304 is shown as being positioned above the second reference column 308 in the upper right corner, those skilled in the art will recognize that the write reference logic 304 may be positioned in any number of other locations. The write reference logic 304 could be in any other corner of the memory unit 300. For example, the write reference logic 304 may be in the upper left corner of the memory unit 300 to minimize routing between the write reference logic 304 and the control logic 110.

The first and second reference columns 306, 308 are provided to generate a self-timed reset signal to the control logic 110 and other components. The reference columns 306, 308 are preferably located adjacent to the memory array 106 on the side opposite the word-line drivers 104, 118. One skilled in the art will realize that the present invention is not limited to positioning the reference columns 306, 308 at this location, but that the reference columns 306, 308 may also be placed at other locations, for example, next to the X Decoder 102 on the other side of the array 106. In contrast to the prior art, the present invention provides a reference column for the read cycle (read reference column 306) and a reference column for the write cycle (write reference column 308).

A unique reference sense amplifier 322 is positioned below the first and second reference columns 306, 308. The first and second reference columns 306, 308 couple the reference sense amplifier 322 to the read reference cell 302 and the write reference logic 304. The reference sense amplifier 322 uses signals from the read reference cell 302 and the write reference logic 304 to generate the self-timed clock signal (STCLK) that reduces the memory access cycle time of the array 106. The reference sense amplifier 322 also uses as input in generating the self-timed clock signal (STCLK), the read/write signal produced by the control logic 110 and used to determine whether the cells of the array 106 are being written or read. This is shown and described more particularly with reference to FIG. 4.

Figure 4:
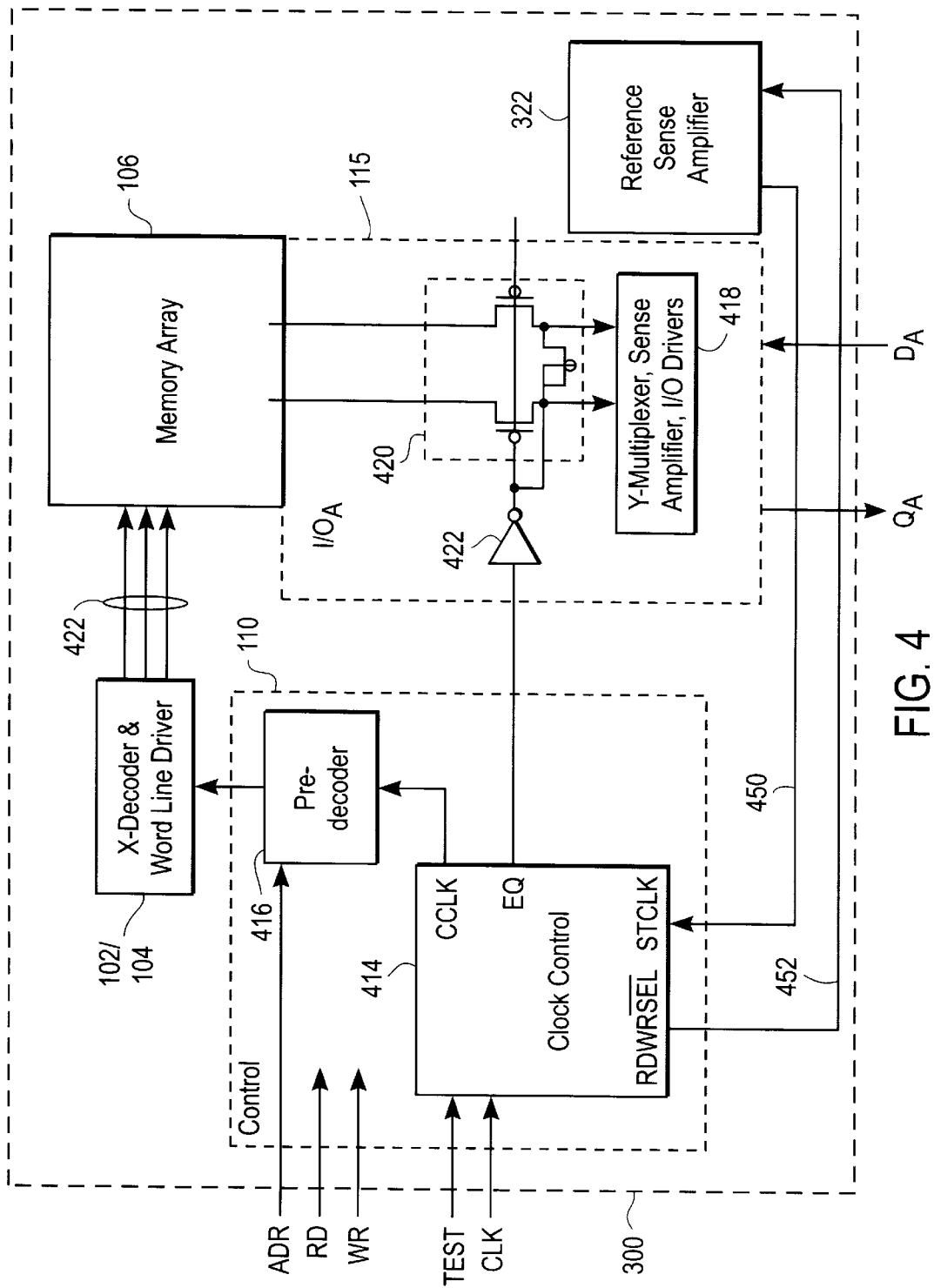
FIG. 4 is a detailed block diagram of portions of the self-timed memory system in accordance with the present invention illustrating control signals provide/to and received from the reference sense amplifier.

Referring now to FIG. 4, portions of the above components are described in more detail so that the context in which the present invention preferably operates can best be understood. FIG. 4 illustrates a block diagram of a preferred embodiment of the memory unit 300 with selected portions relating to memory cycle time shown in more detail. As best shown in FIG. 4, the control logic 110 includes a pre-decoder 416, a clock control circuit 414 and other control circuitry (not shown). The control logic 110 is preferably adapted to receive both the clock signal (CLK) and a test signal (TEST). These signals are provided to the clock control circuit 414.

As additionally shown, the present invention also provides through the clock control circuit 414 the read/write signal (RDWRSEL). This signal is provided by the clock control circuit 414 on signal line 452 to the reference sense amplifier 322 to specify whether a read cycle or a write cycle is being performed. In response, the reference sense amplifier 322 selects either the output of the writ e reference logic 304 (shown in FIG. 3) or the read reference cell 302 (shown in FIG. 3) in generating the STCLK signal returned to the clock control circuit 414 on signal line 450.

As noted above, the control logic 110 also includes other control logic (not shown) for processing the control and address signals that dictate storage in and retrieval of data from the memory array 106. The control logic 110 is formed from conventional digital logic devices formed as part of an integrated circuit, and is similar to conventional types of control logic for memory cores and arrays. The control logic 110 works with the pre-decoder 416 to generate the signals sent to the X-decoder 102/104. One noted difference is the control logic 110 includes a novel clock control unit 414 that generates RDWRSEL which is inputted to the reference sense amplifier 322. The clock control circuit 414 also produces another clock signal (CCLK) that is used by the pre-decoder 416 along with other signals to assert and select the word lines 422. In particular, the pre-decoder 416 receives address signals, write control signals, and read control signals, and uses them in the generation of control signals sent from the pre-decoder 416 to the X-decoder 102 in a conventional manner. Those skilled in the art will recognize (hat the generating and providing of the RDWRSEL signal could be in the control logic 110 bus not part of the clock control circuit 414 in an alternate embodiment.

The X-decoder 102 is coupled to the control logic 110 to receive addressing signals from the control logic 110. The X-decoder 102 receives the address signals, identifies which words of the array 106 are to be asserted and generates a signal for each word to be asserted and outputs the signal. The X-decoder 102 has a conventional design as will be understood to those skilled in the art. The X-decoder 102 is assumed to include the word-line drivers (not shown in FIG. 4). The word-line drivers are preferably groups of buffer drivers that receive signals from the X-decoder 120 and assert and amplify the signals over word lines 422 and portions of the array 106 so that particular words are accessed. Thus, signals provided in the horizontal direction, on lines 422, provide the input from the X-decoder 102 to the combined memory array 106.

Below the memory array 106, the present invention positions a first input/output (I/O) circuit 510. The input/output (I/O) circuit 510 includes a Y-multiplexer, pre-charging circuits 420, and sense amplifiers 418. As partially shown, the first input/output (I/O) circuit 115 includes pre-charging transistors 420 for pre-charging the bit lines of the memory array 106. The input/output (I/O) circuit 115 has a conventional design as will be understood to those skilled in the art.

Figure 5:
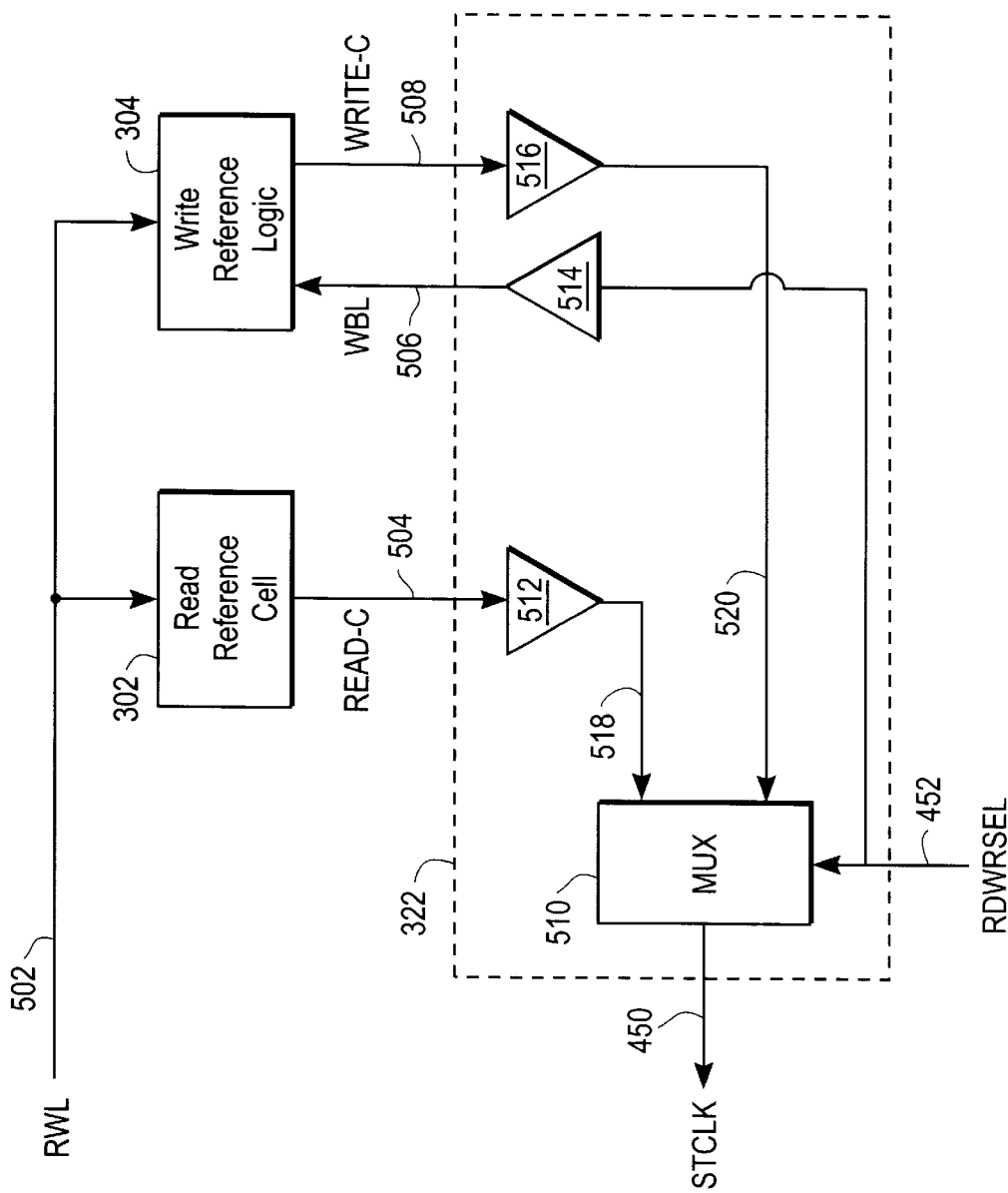
FIG. 5 is a detailed block diagram of portions of the self-timed memory system in accordance with the present invention, in particular, the read reference cell, the write reference logic and the reference sense amplifier.

Referring now to FIG. 5, the key aspects of the present invention are shown. In particular, the read reference cell 302, the write reference logic 304, the reference sense amplifier and their couplings are shown in detail. The read reference cell 302 and the write reference logic 304 each has an input coupled to a signal line 502. Signal line 502 is coupled to the output of the reference word-line driver to receive a reference word-line signal (RWL). The reference word line signal indicates the beginning of memory access cycle. The reference word-line signal is asserted for every memory operation whether it be a read or write operation.

The outputs of the read reference cell 302 and the write reference logic 304 are coupled to the reference sense amplifier 322 by signal lines 504 and 508, respectively. The read reference cell 302 detects the completion of the read cycle and sends a read complete signal (Read-C) on line 504 to the reference sense amplifier 322. The read complete signal indicates when the read cycle is complete. Similarly, the write reference logic 304 detects the end of a write cycle and sends a write complete signal (Write-C) on line 508 to the reference sense amplifier 322. The write complete signal indicates when the write cycle is complete. The write reference logic 304 also receives signals from the reference sense amplifier 322 via line 506 or write bit line (WBL). Preferably, from the write bit line 506 the write reference logic 304 determines when the WBL has completed a fall transition from VDD to VSS. From these input signals and the RDWRSEL signal from the control logic 110, the reference sense amplifier 322 generates the self-timed clock (STCLK) signal.

The present invention advantageously uses either the write complete signal from the write reference logic 304 or the read complete signal from the read reference cell 302 to generate the self-timed clock (STCLK) signal. Since the cycle time for read and write operations may differ, the present invention is able to minimize the memory access cycle time by beginning pre-charging as soon as the memory operation is complete. This is particularly advantageous since the write cycle time can be made smaller than the read cycle time in current memory devices. This reduction in the memory cycle time is in part accomplished by the reference sense amplifier 322 that selects either the output of the write reference logic 304 or the output of the read reference cell 302 to generate the self-timed clock (STCLK) signal. The selection of which signal to use to generate the STCLK signal is based on the read/write signal received from the control logic 110 indicating the type of memory access being performed.

Still more particularly as shown in FIG. 5, the reference sense amplifier 322 includes a multiplexer 510, a first sense amplifier 512, a second sense amplifier 516 and a write buffer 514. The first sense amplifier 512 has an input coupled to line 504 to receive the Read-C signal and an output coupled by line 518 to a first data input of the multiplexer 510. The first sense amplifier 512 detects the point at which there is enough of a signal indicating the read cycle is complete. The write buffer 514 is used to generate a signal that is provided to the write reference logic 304. The input of the write buffer 514 is preferably RDWRSEL and the output is coupled to line 506. The output of the write reference logic 304 is provided on line 508 to the second sense amplifier 516. The second sense amplifier 516 detects the point at which there is enough of a signal indicating the write cycle is complete. The second sense amplifier 516 has an input coupled to line 508 to receive the Write-C signal and an output coupled by line 520 to a second data input of the multiplexer 510. The multiplexer 510 is preferably a 2-to-1 multiplexer, and the output of the multiplexer 510 provides the STCLK signal. The control input of the multiplexer 510 is coupled to line 452 to receive the RDWRSEL signal. Therefore, in response to the read/write signal the multiplexer 510 outputs the corresponding end of cycle detection signal according to whether the operation being performed is read or write. This ensures that the memory cycle time is minimized to cycle time appropriate for the operation.

Figure 7:
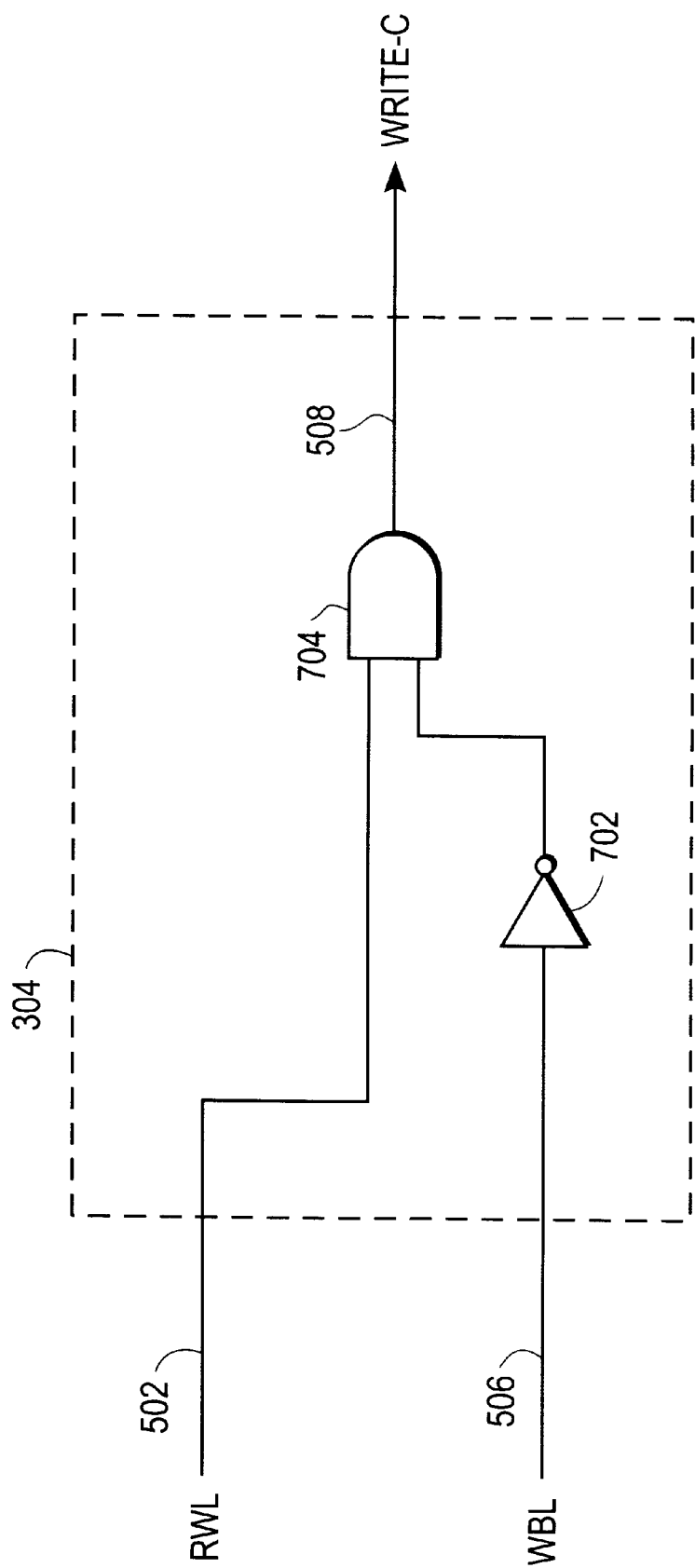
FIG. 7 is a first and preferred embodiment for the write reference logic of the present invention.

Referring now to FIG. 7, a preferred embodiment for the write detection logic 304 is shown. In the preferred embodiment, the write detection logic 304 is elegantly simple and comprises an inverter 702 and an AND-gate 704. The inverter 702 has an input coupled to line 506 to receive the WBL signal, and an output coupled to an input of the AND-gate 704. The AND-gate 704 is preferably a two input AND-gate. The other input of the AND-gate 704 is coupled to line 502 to receive the RWL signal. Thus, the end of a write cycle will be detected when WBL is at VSS and RWL is at VDD. This guarantees that the normal cell in the array 106 is written since the normal WBL is at VSS and the normal RWL is at VDD. As the normal array cell is written, the write reference cell is also written. Thus, when normal WBL is at VSS and the normal RWL is at VDD, WBL for the reference cell is also at VSS and RWL for the reference cell is also at VDD. When these conditions are satisfied, Write-C generates STCLK. Those skilled in the art will recognize that the write cycle time can be increased by connecting additional inverter pairs in series between the signal line 506 and the input of inverter 702, thereby increasing the propagation delay. Additionally, the delay for the reference cell can be modulated to match the delay of the normal cell in the array by adjusting the inverter sizes or by adjusting the trip point of inverter 702.

Figure 2:
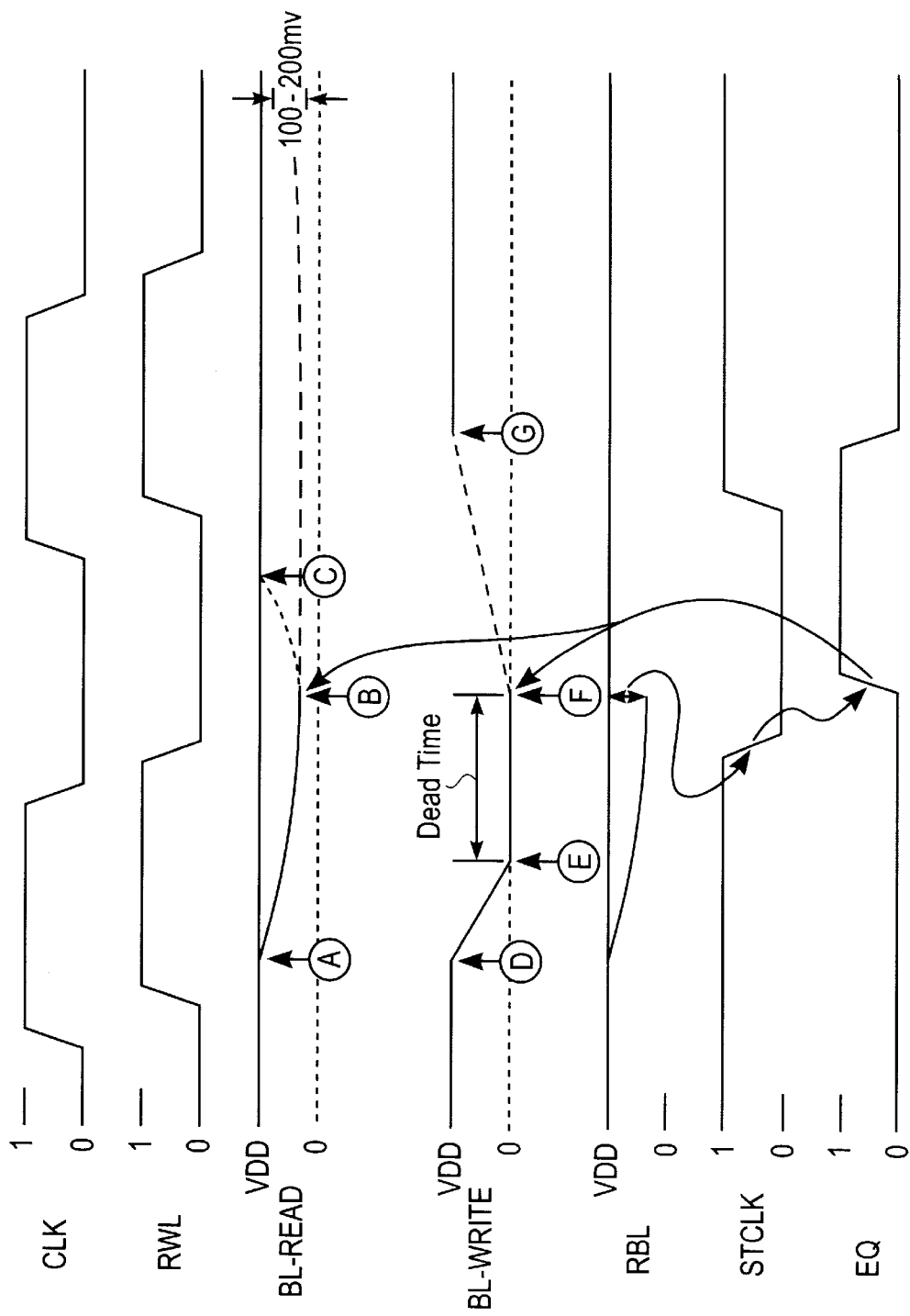
FIG. 2 is timing diagram for the operation of the self-timed memory system of the prior art.
Figure 6:
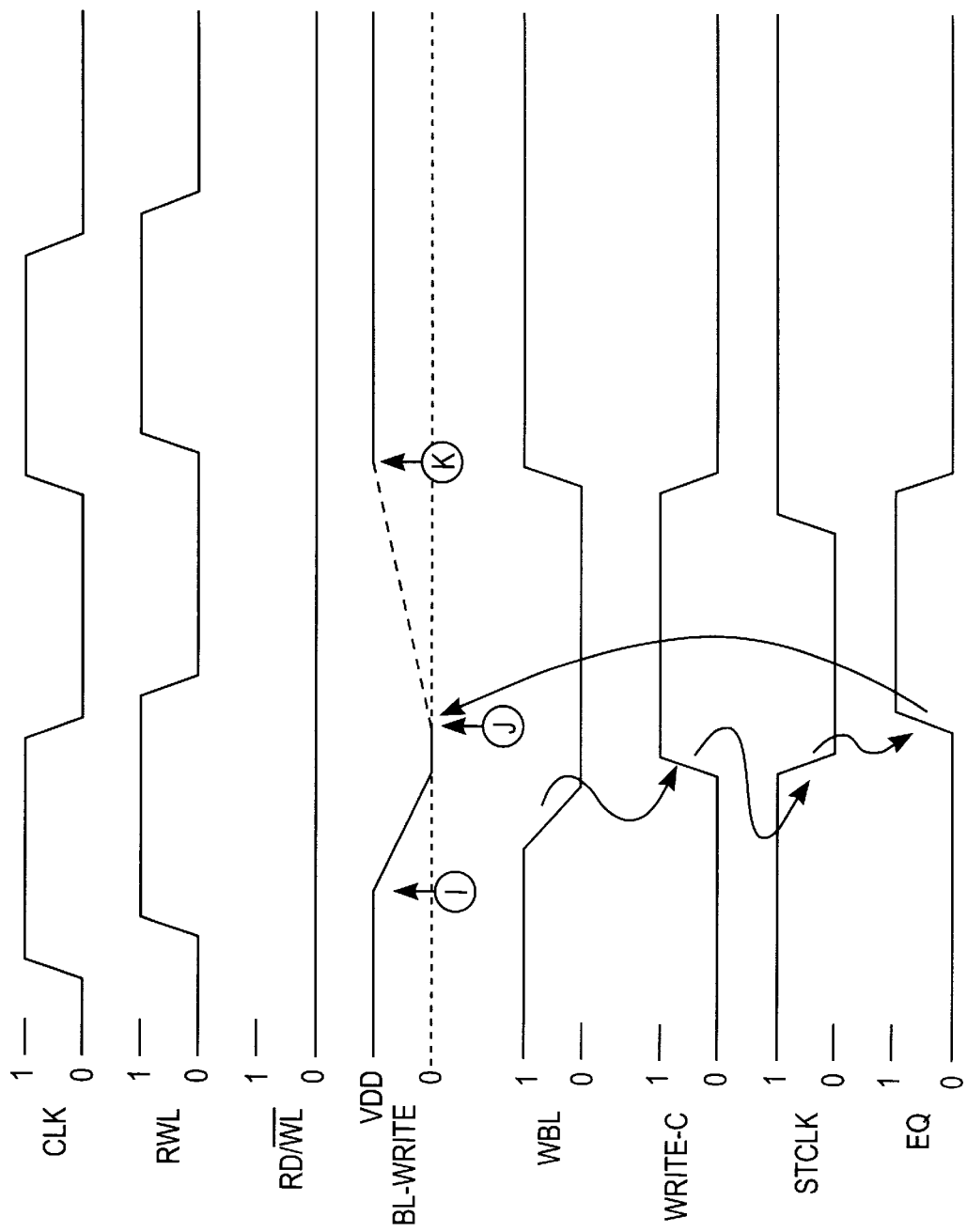
FIG. 6 is a timing diagram for the operation of the self-timed memory system of the present invention during a write cycle.

The improvement achieved by the present invention over the prior art can best be seen by comparing the timing diagram of FIG. 6 with the timing diagram of FIG. 2. With the present invention, read operations have the same memory access time as shown best by BL-Read signal line of FIG. 2. Since the pre-charging cannot begin until the end of the read cycle, the access time remains the same. However, with the present invention, the write access time is reduced significantly since as compared with the BL-write signal of FIG. 2, the WBL signals of FIG. 6 shows that the access time is reduced by eliminating the dead time of the prior art in which the write operation was complete but the read cycle was not. In particular, the present invention provides for time the write cycle to complete between reference point I and reference point J. Immediately after the completion of the write signal, the pre-charging begins and continues from reference point J to reference point K. FIG. 6 also illustrates that the time before the Write-C signal is asserted is the time from the threshold that causes the inverter 702 to transition plus the propagation delay through the inverter 702.

Figure 8:
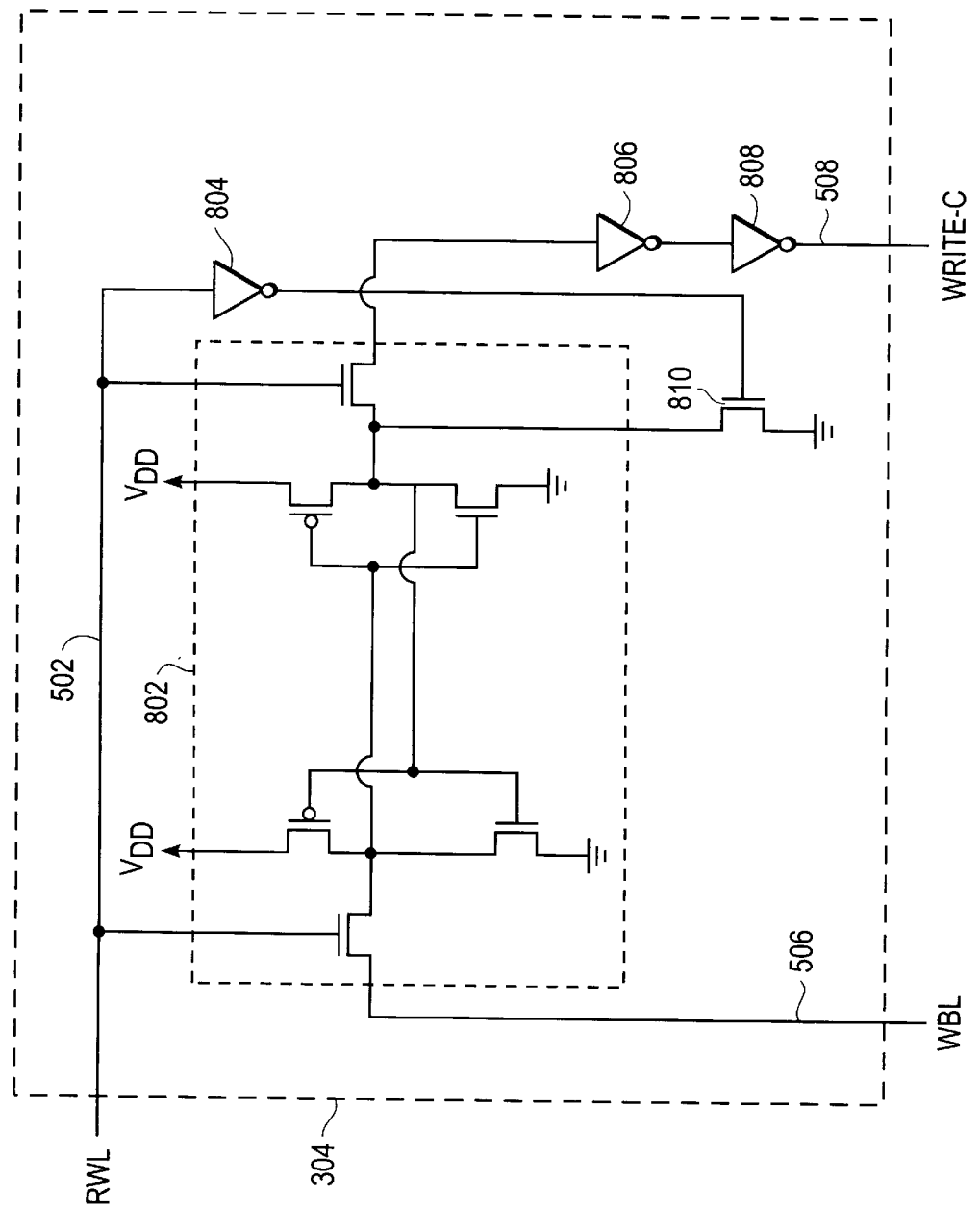
FIG. 8 is a second embodiment for the write reference logic of the present invention.

Referring now to FIG. 8, a second embodiment for the write detection logic 304 is shown. In the second embodiment, the write detection logic 304 is formed of a memory cell 802 and other combinational logic. The second embodiment is advantageous because instead of having to pre-determine the finite time the cells of the array 106 require to complete a write cycle and then matching the propagation delay of the inverter 702 and AND-gate 704 (plus additional inverters) to that finite time, a memory cell 802 is used in the write detection logic 304. Use of the memory cell 802 ensures that the delay before the write detection logic 304 outputs a signal that will be about the same as the actual write cycle in array. The memory cell 802 is preferably a six-transistor cell of a conventional type as shown in FIG. 8. The memory cell 802 preferably has its word line coupled to line 502 to receive the RWL signal. The input bit line of the cell 802 is preferably coupled to line 506 to receive the WBL signal. The output bit line of the memory cell 802 is coupled to two inverters 806, 808 coupled in series. The output of the second inverter 808 provides the output of the write detection logic 304, and is coupled to line 508. The second embodiment of the write detection logic 304 also include circuitry for clearing or writing the cell 802.

This circuitry is preferably an inverter 804 and a transistor 810. The transistor 810 has its gate coupled to cell 802 between the transistors of the cell 802 and the word line transistor. The source of the transistor 810 is coupled to ground, and the gate of the transistor 810 is coupled to the output of the inverter 804. The inverter 804 has its input coupled to receive the RWL signal on line 502. Thus, when the RWL signal is low, the transistor 810 is active to make the value stored in the cell 802 logic "0", thus clearing the cell 802. Likewise, when the RWL signal is high, the transistor 810 is off, thereby allowing the WBL signal to write a logic "1" in the cell 802. Thus, the embodiment in FIG. 8 uses a memory cell as the reference cell to match as closely as possible the delays associated with a normal cell in the memory array. Consequently, the reference cell is reset every cycle by reference WL and is written every cycle by WBL. Thus, the present invention advantageously provides a self-resetting write cycle tracking circuitry. Although the present invention has been discussed in terms of a single port memory device, one skilled in the art will realize that the present invention is not limited to a single port memory device but that the principles of the present invention may also be applied to dual port memory cells as well as multiport memory cells.

From the above description, it will be apparent that the invention disclosed herein provides a novel and advantageous system and method for a self-timed write control in a memory device. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. In a memory device having a memory array comprising a plurality of memory cells, a write completion detection circuit for detecting completion of a write cycle for the memory cells in the memory array, the write completion detection circuit providing for control of a self-timed control clock, the write completion detection circuit having a first input, a second input, and an output, the first input coupled to receive a reference word-line signal, a second input coupled to receive a write bit line signal, and the output coupled to control the self-timed control clock.

2. The memory device of claim 1 wherein the write completion detection circuit detects that the reference word line signal is activated, detects that the write bit line signal is activated, and sends a signal to the self-timed control clock.

3. The memory device of claim 1 wherein the write completion detection circuit comprises a memory cell.

4. The memory device of claim 3 wherein the memory cell is reset after completion of the write cycle.

5. The memory device of claim 3 wherein the memory cell is a six-transistor memory cell.

6. The memory device of claim 1 wherein the write completion detection circuit is self-resetting.

7. The memory device of claim 1 further comprising:
a read reference cell for detecting completion of a read cycle; and
a selection control circuit coupled to the read reference cell and the write completion detection circuit, for selecting an output from either the read reference cell or the write completion detection circuit.

8. The memory device of claim 7 wherein the selection control circuit comprises a multiplexer.

9. The memory device of claim 1 wherein the memory device is a dual port memory device.

10. The memory device of claim 1 wherein the memory device is a multiport memory device.

11. A method for detecting completion of a write cycle for a memory device having a circuit for controlling a self-timed control clock, the method comprising the steps of:
detecting a signal from a write bit line; and
detecting a signal from a reference word line.

12. The method of claim 11 further comprising the step of sending a signal to the self-timed control clock.

13. The method of claim 11 wherein the circuit for controlling comprises an AND gate and an inverter.

14. The method of claim 11 wherein the circuit for controlling comprises a memory cell.

15. The method of claim 14 further comprising the step of resetting the memory cell after the write cycle.

16. The method of claim 11 further comprising the steps of:
detecting completion of a read cycle for the memory device; and
sending a signal to the self-timed control clock.

17. In a memory device having circuitry for reading and writing to cells in the memory device by selecting word lines and pre-charging bit lines during a read cycle or a write cycle, a bit line pre-charging control circuit for controlling pre-charging of the bit lines, the bit line pre-charging control circuit having a first input, a second input, and an output, the first input coupled to receive a reference word line signal, the second input coupled to receive a write bit line signal, and the output coupled to control a pre-charging circuit.

18. The memory device of claim 17 wherein the bit line pre-charging control circuit comprises a memory cell.

19. The memory device of claim 18 wherein the memory cell comprises a six transistor memory cell.

20. The memory device of claim 18 wherein the memory cell may be reset after completion of the write cycle.

21. The memory device of claim 17 further comprising:
a read reference circuit, the read reference circuit having a first input and an output, the first input being coupled to receive the reference word line signal, and the output being coupled to control the pre-charging circuit; and
a selection control circuit, for selecting either the output from the bit line pre-charging control circuit or the output from the read reference circuit.

22. The memory device of claim 21 wherein the selection control circuit is a multiplexer.

23. The memory device of claim 17 wherein the memory device is a dual port memory device.

24. The memory device of claim 17 wherein the memory device is a multiport memory device.

* * * * *